United States Patent [19]

Niikura et al.

[11] Patent Number: 5,702,861

[45] Date of Patent: Dec. 30, 1997

[54] POSITIVE PHOTORESIST COMPOSITION

[75] Inventors: Satoshi Niikura; Takako Suzuki; Kousuke Doi; Hidekatsu Kohara; Toshimasa Nakayama, all of Kanagawa, Japan

[73] Assignee: Tokyo Ohka Kogyo Co., Ltd., Kanagawa, Japan

[21] Appl. No.: 791,166

[22] Filed: Jan. 30, 1997

[30] Foreign Application Priority Data

Jan. 30, 1996 [JP] Japan .................................. 8-035556

[51] Int. Cl.⁶ ............................................. G03F 7/023
[52] U.S. Cl. ........................ 430/191; 430/165; 430/192; 430/193
[58] Field of Search ........................ 430/165, 191, 430/192, 193

[56] References Cited

U.S. PATENT DOCUMENTS

| | | | |
|---|---|---|---|
| 5,112,719 | 5/1992 | Yamada et al. | 430/191 |
| 5,407,778 | 4/1995 | Uetani et al. | 430/192 |
| 5,456,995 | 10/1995 | Ozaki et al. | 430/191 |
| 5,456,996 | 10/1995 | Ozaki et al. | 430/191 |
| 5,478,692 | 12/1995 | Doi et al. | 430/191 |
| 5,501,936 | 3/1996 | Hosoda et al. | 430/191 |
| 5,529,881 | 6/1996 | Kawabe et al. | 430/191 |
| 5,534,382 | 7/1996 | Kawabe et al. | 430/192 |
| 5,601,961 | 2/1997 | Nakayama et al. | 430/192 |

FOREIGN PATENT DOCUMENTS

| | | |
|---|---|---|
| 0 126 625 | 11/1984 | European Pat. Off. . |
| 3-200253 | 9/1991 | Japan . |
| 6-301204 | 10/1994 | Japan . |

*Primary Examiner*—John S. Chu
*Attorney, Agent, or Firm*—Sughrue, Mion, Zinn, Macpeak & Seas, PLLC

[57] ABSTRACT

A positive photoresist composition comprising: (A) an alkali-soluble resin; (B) a quinone diazide group-containing compound; and (C) at least one compound selected from the polyhydroxy compounds, such as 1,3-bis[2-(5-cyclohexyl-2-methyl-4-hydroxyphenyl)-2-propyl]benzene. The composition of the present invention exhibits excellent image contrast between exposed portions and unexposed portions, and actualizes formation of a resist pattern with excellent resolution, exposure range, and focal depth range.

9 Claims, No Drawings

POSITIVE PHOTORESIST COMPOSITION

BACKGROUND OF THE INVENTION

1. Field of the Invention

The present invention relates to a positive photoresist composition, and more specifically, relates to a positive photoresist composition which exhibits an excellent image contrast between exposed portions and unexposed portions, and actualizes formation of a resist pattern with excellent resolution, exposure range, and focal depth range.

2. Description of the Related Art

Hitherto, positive photoresist compositions comprising a coating material of an alkali-soluble resin in combination with a photosensitive ingredient of a quinone diazide group-containing compound are known to have excellent definition, sensitivity and etching resistance, and are developed to be practically used for producing liquid crystal devices or semiconductor devices such as IC's and LSI's.

Novolak resins are particularly useful as such alkali-soluble resin coating materials since, for example, they can be dissolved in alkaline solutions without swelling and thus, have excellent developing properties, and serve as masks for etching while exhibiting excellent heat-resistance against plasma etching.

On the other hand, quinone diazide group-containing compounds as photosensitive ingredients are unique in that they have inhibitory activities against the alkaline-solubilities of novolak resins while they themselves change to be alkali-soluble and also change to possess promoting activities for alkaline-solubilities of the novolak resins when they are irradiated or scrolled with electromagnetic waves such as ultraviolet rays (e.g. g ray or i ray) or far ultraviolet rays including an excimer laser beam, or with corpuscular rays such as an electron beam.

A large number of such positive photoresist compositions, which contain an alkali-soluble novolak resin and a quinone diazide group-containing compound exhibiting great changes in its characteristics when receiving radiation, were developed and made to be practicable as disclosed in, for example, the specification of U.S. Pat. No. 4,377,631, Japanese Patent Laid-Open Nos. 62-35349, 1-142548 and 1-179147, and Japanese Patent Publication No. 3-4897.

Meanwhile, in recent years, integration of semiconductor devices has increasingly progressed, and work accuracy capable of making a super fine pattern at a level of sub-micron (below 1 micron) is required for manufacturing super LSI's, and accordingly, positive photoresist compositions are required to be further improved in definition and resist properties of a resist pattern to be formed.

For example, Japanese Patent Laid-Open No. 2-275955 describes sensitivity improvements by the addition of a tris(hydroxyphenyl)methane compounds such as bis(2,5-dimethyl-4-hydroxyphenyl)-2-hydroxyphenylmethane as a sensitivity-enhancing agent. Similarly, Japanese Patent Laid-Open Nos. 3-200252 and 3-200253 describe the addition of 1-[1-(4-hydroxyphenyl)isopropyl]-4-[1,1-bis(4-hydroxyphenyl)ethyl]benzene and the addition of 1,4-bis[2-(3,5-dimethyl-4-hydroxyphenyl)-2-propyl]benzene, respectively.

Although such polyphenol compounds having 3 to 4 benzene rings as above surely exhibit excellent effects as sensitivity-enhancing agents, image contrast between exposed portions and unexposed portions is insufficient, and therefore, resolution, exposure range and focal depth range are still unsatisfactory.

Further, Japanese Patent Laid-Open No. 6-301204 discloses a photoresist which utilizes a tris(hydroxyphenyl) methane compound having a cyclohexyl group as an additive. Similar to the above-described polyphenol compounds, however, such a polyphenol compound is still unsatisfactory in exposure range and focal depth range though it is useful as a sensitivity-enhancing agent.

SUMMARY OF THE INVENTION

The present invention has been accomplished in the above-described view points, and the object of the present invention is to provide a positive photoresist composition which exhibits an excellent image contrast between exposed portions and unexposed portions, and actualizes formation of a resist pattern with excellent resolution, exposure range, and focal depth range.

The inventors earnestly conducted several investigations in order to solve the above problems, found that the above problems can be solved by using an alkali-soluble resin, a quinone diazide group-containing compound and polyhydroxy compound having a specific chemical structure, and have accomplished the present invention based on this finding.

Specifically, the present invention provides a positive photoresist composition comprising:

(A) an alkali-soluble resin;

(B) a quinone diazide group-containing compound; and (C) at least one polyhydroxy compound selected from the polyhydroxy compounds expressed by the following general formula (I),

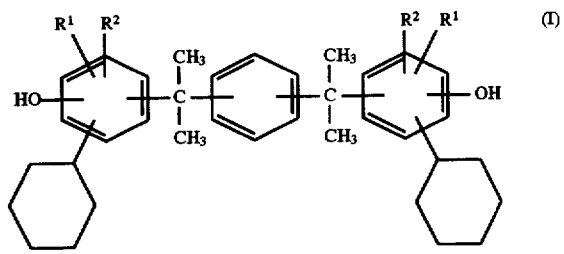

in which each of $R^1$ and $R^2$ is independently selected from a hydrogen atom, a hydroxyl group, an alkyl group having 1 to 6 carbon atoms, an alkoxy group having 1 to 6 carbon atoms, and a halogen atom.

DETAILED DESCRIPTION OF THE INVENTION

The positive photoresist according to the present invention will be illustrated in detail below.

The alkali-soluble resin to be used as the ingredient (A) is not especially limited, and is optionally selected from compounds ordinarily used as a coating ingredient of a positive photoresist composition. Preferably used are, for example, a condensation product from an aromatic hydroxy compound with an aldehyde compound or a ketone compound; and polyhydroxystyrene, and derivatives thereof.

Examples of the above-mentioned aromatic hydroxy compound may include phenol; cresol compounds such as m-cresol, p-cresol and o-cresol; xylenol compounds such as 2,3-xylenol, 2,5-xylenol, 3,5-xylenol, and 3,4-xylenol; alkylphenol compounds such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, and 2-tert-butyl-5-methylphenol; alkoxyphenol compounds such as p-methoxyphenol, m-methoxyphenol, p-ethoxyphenol, m-ethoxyphenol, p-propoxyphenol, and m-propoxyphenol; isopropenylphenol compounds such as o-isopropenylphenol, p-isopropenylphenol, 2-methyl-4-isopropenylphenol, and 2-ethyl-4-isopropenylphenol; arylphenol compounds such as phenylphenol; and polyhydroxyphenol compounds such as 4,4'-dihydroxybiphenyl, bisphenol A, resorcinol, hydroquinone, and pyrogallol. Each of these compounds may be used solely or in combination with the others. Particularly, m-cresol, p-cresol, 2,5-xylenol, 3,5-xylenol, and 2,3,5-trimethylphenol are preferred among the above-listed aromatic hydroxy compounds.

As to the above-mentioned aldehyde compound, examples may include formaldehyde, paraformaldehyde, trioxan, acetaldehyde, propionaldehyde, butylaldehyde, trimethylacetaldehyde, acrolein, crotonaldehyde, cyclohexanealdehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamic aldehyde. Each of these compounds may be used solely or in combination with the others. Among the above-listed aldehyde compounds, formaldehyde is preferred since it is easily available. Particularly, for improving thermostability, formaldehyde is preferably used in combination with a hydroxybenzaldehyde compound.

Examples of the above-mentioned ketone compound may include acetone, methyl ethyl ketone, diethyl ketone, and diphenyl ketone. Each of these compounds may be used solely or in combination with the others.

As to a combination of the aromatic hydroxy compound and the ketone compound, a combination of pyrogallol and acetone is especially preferred.

Condensation of an aromatic hydroxy compound with an aldehyde compound or a ketone compound may be carried out in the presence of an acidic catalyst according to a publicly-known method. Hydrochloric acid, sulfuric acid, formic acid, oxalic acid, paratoluenesulfonic acid, or the like can be used as the acidic catalyst. As to the condensation product thus obtained, treatment such as fractionation to cut off the low molecular weight components is preferably performed to leave the thermostable components. Various methods can be employed for such treatment. For example, a resin obtained through a condensation reaction, i.e. a condensation product, is dissolved in good solvent suh as an alcohol solvent such as methanol and ethanol, a ketone solvent such as methyl ethyl ketone, ethyleneglycol monoethyl ether acetate, or tetrahydrofuran, and subsequently, precipitated by pouring the above-obtained solution into water.

The weight average molecular weight of the condensation products after cutting off the low molecular weight components is set within a range of 2000 to 25000, and preferably, 2500 to 20000. Here, the weight average molecular weight is measured in terms of polystyrene by gel permeation chromatography (GPC).

As to the above-mentioned polyhydroxystyrene and derivatives thereof, examples may include homopolymers of vinylphenol, copolymers of vinylphenol and a comonomer which can be copolymerized with vinylphenol. Examples of such comonomers may include acrylic acid derivatives; acrylonitrile; methacrylic acid derivatives; methacrylonitrile; styrene; and styrene derivatives such as α-methylstyrene, p-methylstyrene, o-methylstyrene, p-methoxystyrene, and p-chlorostyrene.

Of these alkali-soluble resin (A), novolak resins obtained by condensation of at least one kind selected from m-cresol, p-cresol, xylenol compounds and trimethylphenol compounds with formaldehyde in the presence of an acid catalyst are preferable in practical use.

The quinone diazide group-containing compound to be used as the ingredient (B) which serves as a photosensitive ingredient is not especially limited, and is optionally selected from ordinarily used compounds. Examples of such a compound may include ester compounds of naphthoquinone-1,2-diazidesulfonic acid, ester compounds of orthobenzoquinonediazidesulfonic acid, and ester compounds of orthoanthraquinonediazidesulfonic acid. Preferably used are ester compounds of a hydroxy compound with naphtoquinone-1,2-diazidesulfonyl halide such as naphthoquinone-1,2-diazide-5-sulfonyl chloride, naphthoquinone-1,2-diazide-4-sulfonyl chloride, and naphthoquinone-1,2-diazide-6-sulfonyl chloride.

Here, the compounds shown in the following items (i) to (iv) may be listed as examples of the above-mentioned hydroxy compound.

(i) Polyhydroxybenzophenone Compounds

Examples of compounds belonging to this category are 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, 2,3,3',4,4',5'-hexahydroxybenzophenone.

(ii) Hydroxyaryl Compounds Expressed by the Following General Formula (II)

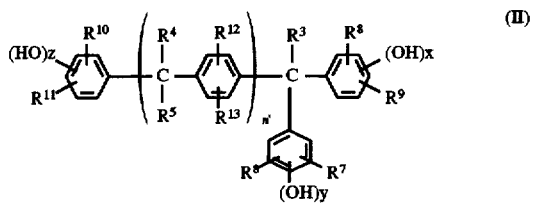

(In the above formula, each of $R^3$ to $R^5$ is independently selected from a hydrogen atom and an alkyl group having 1 to 4 carbon atoms; each of $R^6$ to $R^{11}$ is independently selected from a hydrogen atom, a halogen atom, an alkyl group having 1 to 4 carbon atoms, an alkoxy group having 1 to 4 carbon atoms, an alkenyl group having 2 to 4 carbon atoms, and cycloalkyl group having 5 to 8 carbon atoms; each of $R^{12}$ and $R^{13}$ is independently selected from a hydrogen atom, a halogen atom, and an alkyl group having 1 to 4 carbon atoms; each of x, y, and z is an integer independently selected from 1, 2, and 3; and n' is 0 or 1.)

Examples of compounds belonging to this category are tris(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5 -dimethylphenyl)-3,4- dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, bis(3-cyclohexyl-4-hydroxy-5-methylphenyl)-3,4-dihydroxyphenylmethane, 1-[1-(4-hydroxyphenyl)isopropyl]-4-[1,1-bis(4-hydroxyphenyl) ethyl]benzene, and 1-[1-(3-methyl-4-hydroxyphenyl) isopropyl]-4-[1,1-bis(3-methyl-4-hydroxyphenyl)ethyl] benzene.

(iii) Bis(hydroxyphenyl)alkane Compound Expressed by the Following General Formula (IV)

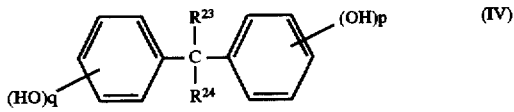

(In the above formula, each of $R^{23}$ and $R^{24}$ is independently selected from a hydrogen atom and an alkyl group having 1 to 4 carbon atoms; and each of p and q is an integer independently selected from 1, 2 and 3.)

Examples of compounds belonging to this category are 2-(2,3,4-trihydroxyphenyl)-2-(2',3',4'-trihydroxyphenyl) propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl) methane, bis(2,4-dihydroxyphenyl)methane.

(iv) Hydroxyaryl Compound

Examples of compounds belonging to this category are phenol, p-methoxyphenol, dimethylphenol, hydroquinone, bisphenol A, naphthol, pyrocatechol, pyrogallol monomethyl ether, pyrogallol-1,3-dimethyl ether, gallic acid, partially esterified gallic acid, and partially etherified gallic acid.

Each of the above esterified compounds (quinone diazide group-containing compounds) as a photosensitive ingredient can be prepared by condensing the above-described naphthoquinone-1,2-diazidesulfonyl halide with a hydroxy compound from among the compounds described in the above items (i) to (iv) to perform complete or partial esterification. In general, this condensation reaction is performed in an organic solvent such as dioxane, N-methylpyrrolidone, and dimethylacetamide, and advantageously, in the presence of an alkaline condensing agent such as triethanolamine, alkali carbonate, and alkali hydrogencarbonate.

Incidentally, it is preferable to use an ester compound prepared by condensing the above-described hydroxy compound with naphthoquinone-1,2-diazide-4(or 5)-sulfonyl halide, wherein the mole number of the latter is 50% or more, and more preferably, 60% or more of that of the hydroxy groups in the hydroxy compound, namely, the ester compound has an esterification degree of 50% or more, and more preferably, 60% or more. High definition can be achieved by using such an ester compound.

As occasion demands, the composition of the present invention may contain, as sensitivity-enhancing agents, one or more compounds selected from the hydroxyaryl compounds expressed by the above general formula (II) and the hydroxyaryl compounds expressed by the following general formula (III) within a content range in which the desirable performance of the composition does not deteriorate.

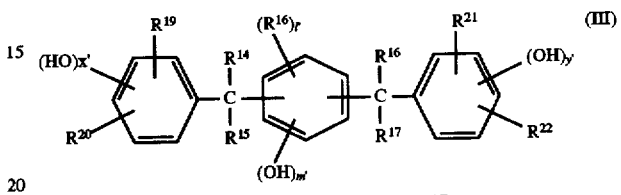

(In the above formula, each of $R^{14}$ to $R^{17}$ is independently selected from a hydrogen atom and an alkyl group having 1 to 4 carbon atoms; each of $R^{18}$ to $R^{22}$ is independently selected from a hydrogen atom, a halogen atom, and an alkyl or alkoxy group having 1 to 4 carbon atoms; and each of l', m', x' and y' is an integer independently selected from 1, 2, and 3.)

Among the above-exemplified hydroxyaryl compounds expressed by the above-described general formula (II), examples preferred for this purpose are bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl) isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl]benzene.

On the other hand, examples of hydroxyaryl compounds expressed by the above general formula (III) may include 2,6-bis[1-(2,4-dihydroxyphenyl)isopropyl]4-methylphenol, 4,6-bis[1-(4-hydroxyphenyl)isopropyl]resorcin, 4,6-bis(3,5-dimethoxy-4-hydroxyphenylmethyl)pyrogallol, 4,6 -bis(3, 5-dimethyl-4-hydroxyphenylmethyl)pyrogallol, 2,6-bis(3-methyl-4,6-dihydroxyphenylmethyl)-4-methylphenol, and 2,6-bis(2,3,4-trihydroxypenylmethyl)-4-methylphenol. Among these, particularly preferred is 4,6-bis[1-(4-hydroxyphenyl)isopropyl]resorcin.

For mixtures containing such hydroxyaryl compounds, the content is selected within a range of 5 to 50% by weight, and preferably, 10 to 35% by weight relative to the ingredient (A), i.e. an alkali-soluble resin.

In the present invention, in addition to the ingredients (A), (B) and (C), the use of such hydroxyaryl compounds within the above-described range is preferred since the exposure range, definition and focal depth range can be improved, and excellent sensitivity can be achieved.

In the composition of the present invention, the content of the ingredient (B) is preferably selected within a range of 5 to 100% by weight, and more preferably, 10 to 50% by weight relative to the total amount of the ingredient (A), i.e. an alkali-soluble resin. Where the above described hydroxyaryl compounds (sensitivity-enhancing agents) is used, the content ratio of the ingredient (B) may be considered relative to the total amount of the above (A) and the hydroxyaryl compound. With an ingredient (B) content below this range, an image faithful to the original pattern cannot be obtained and transcribing ability will be lowered. On the other hand, with an ingredient (B) content above this range, sensitivity will be reduced, homogeneity in the resist film to be formed will decrease, and definition will deteriorate. The ingredient (B) may be a sole compound or a mixed composition comprising two or more compounds.

The ingredient (C) comprises the polyhydroxy compound expressed by the above-described general formula (I) ($R^1$ and $R^2$ in the formula have been defined above). Hitherto, in resist compositions, polyphenol compounds have been used as additives such as for improvement in sensitivity. In contrast to such polyphenol compounds, the above-mentioned polyhydroxy compounds have no hydroxy groups in the benzene rings constituting the central portions of their chemical structure, and are characterized by having at least one hydroxy group and at least one cyclohexyl ring at each of their side benzene rings. The hydroxy groups at both the side benzene rings are in charge of alkali-solubility while the cyclohexyl rings at both the side benzene rings and the central benzene ring having no hydroxy group are in charge of alkali-insolubility. Probably, this balance between alkali-solubility and alkali-insolubility may contribute to achieving a resist pattern by an alkali development which has excellent contrast between the exposed portions and the exposed portions, and also, excellent resolution, exposure range, and focal depth range.

Although the method for producing the compounds expressed by the general formula (I) is not especially limited, a method such as described in Japanese Patent Laid-Open No. 60-135418 can be employed. In such a method, for example, a cyclohexyl group-containing phenol compound is reacted with a compound such as 1,3-bis(2-hydroxy-2-propyl)benzene, 1,4-bis(2-hydroxy-2-propyl)benzene, 1,3-bis(isopropenyl)benzene, and 1,4-bis(isopropenyl)benzene in an organic solvent in the presence of an acid catalyst.

Typical examples of the above-mentioned cyclohexyl group-containing phenol compound may include 2-cyclohexylphenol, 4-cyclohexylphenol, and 3-methyl-6-cyclohexylphenol.

As to the definition of $R^1$ and $R^2$ in the general formula (I), typical examples of the "alkyl group having 1 to 6 carbon atoms" may include a methyl group, an ethyl group, a propyl group, a n-butyl group, an isobutyl group, a sec-butyl group, a t-butyl group, a pentyl group, and a hexyl group. Further, typical examples of the "alkoxy group having 1 to 6 carbon atoms" may include a methoxy group, an ethoxy group, a propoxy group, an isopropoxy group, a n-butoxy group, an isobutoxy group, a sec-butoxy group, a t-butoxy group, a pentyloxy group, and a hexyloxy group. Moreover, examples of the "halogen atom" may include a chlorine atom, a bromine atom, and an iodine atom.

Typical examples of the polyhydroxy compounds expressed by the general formula (I) may include compounds expressed by the following formulae without limiting the scope of the polyhydroxy compounds which can be used in the present invention.

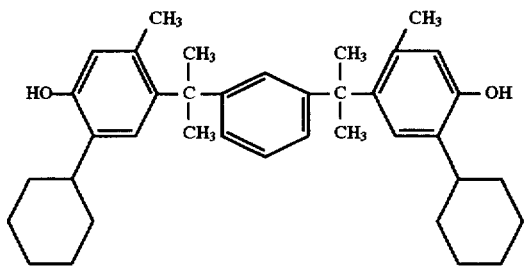

-continued

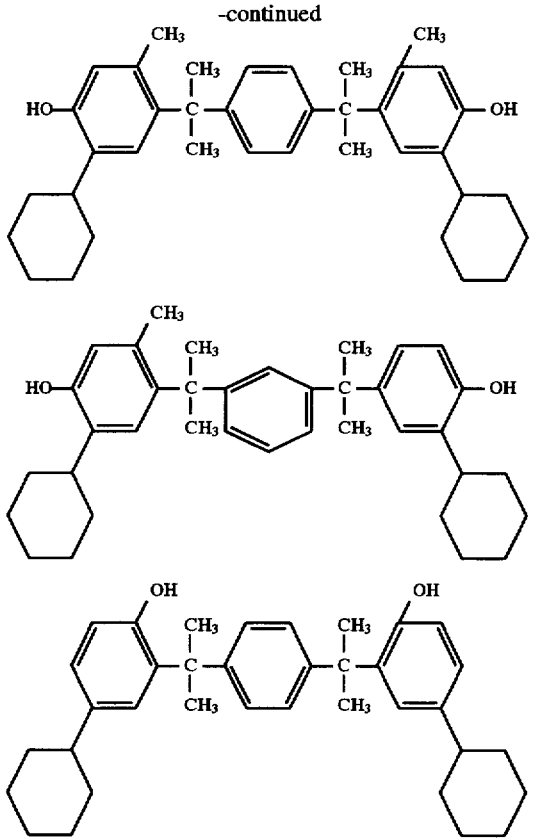

Each of these compounds may be used solely or in combination with one or more of the others.

The content of the ingredient (C) is within a range of 0.1 to 15% by weight, and more preferably, 0.2 to 8% by weight, and particularly preferably, 0.5 to 6% by weight relative to the amount of the ingredient (A), i.e. an alkali-soluble resin. With an ingredient (C) content below this range, the contrast between the exposed portions and the unexposed portions will deteriorate. On the other hand, with an ingredient (C) content above this range, sensitivity will be reduced, and definition and the shape of the pattern to be formed will deteriorate.

As occasion demands, the composition of the present invention may further contain one or more additives within content ranges in which the object of the present invention is not hindered. Such additives are, for example, miscible additives; ultraviolet absorbents for preventing halation such as 2,2',4,4'-tetrahydroxybenzophenone, 4-dimethylamino-2', 4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene, and curcumin; surfactants for preventing striation, e.g. fluorine-based surfactants such as Florade FC-430 and FC-431 (manufactured by Sumitomo 3M Ltd.), FTOP EF122A, EF122B, EF122C and EF126 (manufactured by Tochem Products Corporation).

The composition of the present invention is preferably used in the form of a solution, namely, the ingredient (A) an alkali-soluble resin, the photosensitive ingredient (B) a quinone diazide group-containing compound, the ingredient (C) at least one polyhydroxy compound expressed by the above-described general formula (I), and various optional additives dissolved in a proper solvent.

Examples of such a solvent may include ketone compounds such as acetone, methyl ethyl ketone, cyclohexanone, methyl isoamyl ketone, 2-heptanone; polyhydric alcohols and derivatives thereof such as ethylene glycol, propylene glycol, diethylene glycol, ethylene glycol monoacetate, propylene glycol monoacetate, diethylene glycol monoacetate, monomethyl ether thereof, monoethyl ether thereof, monopropyl ether thereof, monobutyl ether thereof, and monophenyl ether thereof; cyclic ether compounds such as dioxane; and ester compounds such as ethyl lactate, methyl acetate, ethyl acetate, butyl acetate, methyl pyruvate, ethyl pyruvate, methyl methoxypropionate, and ethyl ethoxypropionate ethyl. Each of these solvent may be used solely or in combination with the others.

The composition of the present invention is suitably used, for example, in the following manner. Initially, a substrate such as a silicon wafer is coated using a spinner or the like with a solution which is prepared by dissolving the ingredient (A) comprising an alkali-soluble resin, the ingredient (B) comprising a quinone diazide group-containing compound, the ingredient (C) comprising a polyhydroxy compound, and optional additives in a proper solvent as described above. Secondly, the resultant is dried to form a photosensitive layer, and then subjected to exposure through a desired mask pattern, which may be performed by irradiation with ultraviolet rays from a light source unit such as a low pressure mercury lamp, a high pressure mercury lamp, an extra-high pressure mercury lamp, an arc lamp, and a xenon lamp, or by scanning irradiation with an electron beam. Subsequently, the exposed portions are selectively dissolved and removed by dipping in a developing solution, for example, an aqueous alkaline solution such as containing 1 to 10% by weight of tetramethylammonium hydroxide (TMAH) to obtain an image faithful to the mask pattern.

EXAMPLES

The present invention is further illustrated in detail with examples below.

Incidentally, the positive photoresist compositions according to examples below were evaluated as follows.

<Exposure Range>

Each sample was applied to a silicon wafer using a spinner, and dried on a hot plate at 90° C. for 90 sec. to obtain a resist film having a thickness of 1.05 μm. The resist film thus obtained was then subjected to exposures with time periods from 0.1 sec. to 0.01 sec. using a reducing projection aligner NSR-2005i10D (manufactured by Nikon Corporation, NA=0.57). Subsequently, the resultant was developed in an aqueous solution containing 2.38% by weight of tetramethylammonium hydroxide at 23° C. for 60 sec., and dried after washing with water for 30 sec. The exposure time period (ms) in which the film thickness of the exposed portion reached zero after development was defined as a value Eth. Meanwhile, the exposure time period (ms) required for achieving a line-and-space replication with a width ratio of 1:1 from a mask pattern 0.50 μm in width was measured and defined as Eop. The ratio Eop/Eth is regarded as the index of exposure range.

<Resolution>

The maximum resolution at the exposure value required for replicating a mask pattern 0.50 μm in width is regarded as the index of resolution.

<Focal Depth Range>

On each sample, resist patterns were formed by performing exposure with different focal points, and by proper development, wherein exposure was performed using a reducing projection aligner NSR-2005i10D (manufactured by Nikon Corporation, NA=0.57) with a standard exposure value of Eop (the exposure value required for achieving a line-and-space replication with the width ratio of 1:1 from a mask pattern of 0.50 μm in width). The resist patterns thus obtained were then observed on SEM (Scanning Electron Microscope) photographs. Based on the SEM photographs, the focal points at which 0.40 μm rectangular resist patterns could be obtained were examined. The maximum difference (μm) in such focal points was regarded as the focal depth range.

Example 1

A mixture was prepared by mixing m-cresol and p-cresol in a mole ratio of 4:6. Formalin was then added to this mixture, and condensation was carried out in the presence of an oxalic acid catalyst according to an ordinary method. The resulting cresol-novolak resin was subjected to separation treatment to cut off the low molecule components. As a result, a cresol-novolak resin having a weight average molecular weight of 7,000 was obtained.

In 308 parts by weight of 2-heptanone, there were dissolved 100 parts by weight of the cresol-novolak resin which had been subjected to cutting off the low molecule components, 30 parts by weight of an esterified compound as a quinone diazide group-containing compound which had been prepared by reacting bis(3-cyclohexyl-4-hydroxy-5-methylphenyl)-3,4-dihydroxyphenylmethane with naphthoquinone-1,2-diazide-5-sulfonyl chloride in the mole ratio of 1:2, and 2 parts by weight of 1,3-bis[2-(5-cyclohexyl-2-methyl-4-hydroxyphenyl)-2-propyl]benzene. The resulting solution was then filtrated with a membrane filter having a pore size of 0.2 μm to obtain a positive photoresist composition.

The positive photoresist composition thus prepared was evaluated on exposure range, resolution, and focal depth range. The results are shown in Table 1.

Example 2

A positive photoresist composition was prepared in the same manner as in Example 1 except that 1,4-bis[2-(5-cyclohexyl-2-methyl-4-hydroxyphenyl)-2-propyl]benzene was used instead of 1,3-bis[2-(5-cyclohexyl-2-methyl-4-hydroxyphenyl)-2-propyl]benzene used in Example 1.

The positive photoresist composition thus obtained was evaluated on exposure range, resolution, and focal depth range. The results are shown in Table 1.

Example 3

A positive photoresist composition was prepared in the same manner as in Example 1 except that 20 parts by weight of 1-[1-(4-hydroxyphenyl) isopropyl]-4-[1,1-bis(4-hydroxyphenyl)ethyl]benzene was further added to the solution.

The positive photoresist composition thus obtained was evaluated on exposure range, resolution, and focal depth range. The results are shown in Table 1.

Comparative Example 1

A positive photoresist composition was prepared in the same manner as in Example 1 except that bis(2,5-dimethyl-4-hydroxyphenyl)-2-hydroxyphenylmethane was used instead of 1,3-bis[2-(5-cyclohexyl-2-methyl-4-hydroxyphenyl)-2-propyl]benzene used in Example 1.

The positive photoresist composition thus obtained was evaluated on exposure range, resolution, and focal depth range. The results are shown in Table 1.

Comparative Example 2

A positive photoresist composition was prepared in the same manner as in Example 1 except that 1-[1-(4-hydroxyphenyl)isopropyl]-4-[1,1-bis(4-hydroxyphenyl)ethyl]benzene was used instead of 1,3-bis[2-(5-cyclohexyl-2-methyl-4-hydroxyphenyl)-2-propyl]benzene used in Example 1.

The positive photoresist composition thus obtained was evaluated on exposure range, resolution, and focal depth range. The results are shown in Table 1.

Comparative Example 3

A positive photoresist composition was prepared in the same manner as in Example 1 except that bis(5-cyclohexyl-2-methyl-4-hydroxyphenyl)-2,4-dihydroxyphenylmethane was used instead of 1,3-bis[2-(5-cyclohexyl-2-methyl-4-hydroxyphenyl)-2-propyl]benzene used in Example 1.

The positive photoresist composition thus obtained was evaluated on exposure range, resolution, and focal depth range. The results are shown in Table 1.

TABLE 1

|  | Exposure Range | Resolution (μm) | Focal Depth Range (μm) |
|---|---|---|---|
| Example 1 | 1.9 | 0.32 | 1.4 |
| Example 2 | 1.9 | 0.32 | 1.4 |
| Example 3 | 2.1 | 0.30 | 1.8 |
| Com. Ex. 1 | 1.7 | 0.38 | 0.8 |
| Com. Ex. 2 | 1.7 | 0.38 | 0.8 |
| Com. Ex. 3 | 1.6 | 0.40 | 0.6 |

As described above, according to the present invention, there can be provided a positive photoresist composition which exhibits excellent image contrast between exposed portions and unexposed portions, and actualizes formation of a resist pattern with excellent resolution, exposure range, and focal depth range.

While the invention has been described in detail and with reference to specific embodiments thereof, it will be apparent to one of ordinary skill in the art that various changes and modifications can be made therein without departing from the spirit and scope thereof.

What is claimed is:
1. A positive photoresist composition comprising:
   (A) an alkali-soluble resin;
   (B) a quinone diazide group-containing compound; and
   (C) at least one compound selected from the polyhydroxy compounds expressed by the following general formula (I),

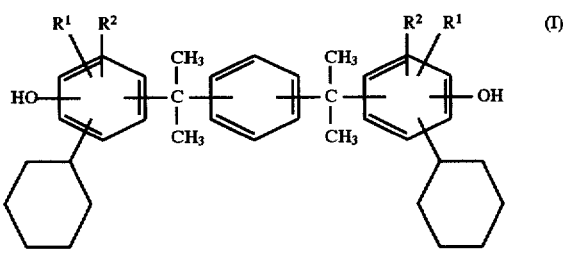

wherein each of $R^1$ and $R^2$ is independently selected from a hydrogen atom, a hydroxyl group, an alkyl group having 1 to 6 carbon atoms, an alkoxy group having 1 to 6 carbon atoms, and a halogen atom.

2. The positive photoresist coating composition according to claim 1, wherein 5 to 100% by weight of said (B) quinone diazide group-containing compound relative to said (A) alkali-soluble resin is used.

3. The positive photoresist composition according to claim 1 or 2, wherein each of $R^1$ and $R^2$ in the above general formula (I) is independently selected from a hydrogen atom, and an alkyl group having 1 to 6 carbon atoms.

4. The positive photoresist composition according to claim 3, wherein $R^1$ is a methyl group and $R^2$ is a hydrogen atom.

5. The positive photoresist composition according to claim 1 or 2, wherein the content of the ingredient (C) is 0.1 to 15% by weight relative to the ingredient (A).

6. The positive photoresist composition according to claim 1 or 2, wherein the content of the ingredient (C) is 0.2 to 8% by weight relative to the ingredient (A).

7. The positive photoresist composition according to claim 1, wherein the ingredient (A) comprises a novolak resin.

8. The positive photoresist composition according to claim further comprising at least one compound selected from:
   hydroxyaryl compounds expressed by the following formula (II),

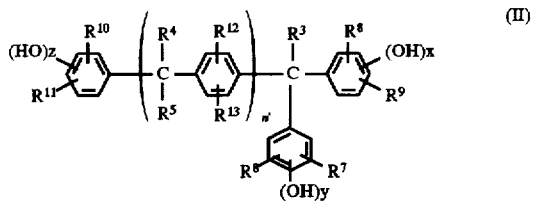

wherein each of $R^3$ to $R^5$ is independently selected from a hydrogen atom and an alkyl group having 1 to 4 carbon atoms; each of $R^6$ to $R^{11}$ is independently selected from a hydrogen atom, a halogen atom, an alkyl group having 1 to 4 carbon atoms, an alkoxy group having 1 to 4 carbon atoms, an alkenyl group having 2 to 4 carbon atoms, and a cycloalkyl group having 5 to 8 carbon atoms; each of $R^{12}$ and $R^{13}$ is independently selected from a hydrogen atom, a halogen atom, and an alkyl group having 1 to 4 carbon atoms; each of x, y, and z is an integer independently selected from 1, 2, and 3; and n' is 0 or 1; and,
   hydroxyaryl compounds expressed by the following formula (III),

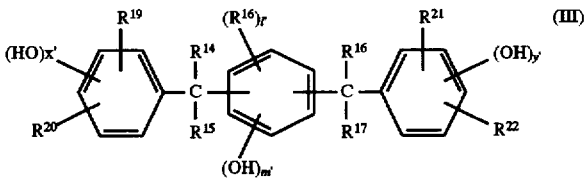

wherein each of $R^{14}$ to $R^{17}$ is independently selected from a hydrogen atom and an alkyl group having 1 to 4 carbon atoms; each of $R^{18}$ to $R^{22}$ is independently selected from a hydrogen atom, a halogen atom, and an alkyl or alkoxy group having 1 to 4 carbon atoms; and each of l', m', x' and y' is an integer independently selected from 1, 2, and 3.

9. The positive photoresist composition according to claim 8, wherein 5 to 50% by weight of said hydroxyaryl compounds relative to said (A) alkali-soluble resin is used.

* * * * *